United States Patent
Chou

(10) Patent No.: US 7,847,601 B2
(45) Date of Patent: Dec. 7, 2010

(54) COMPARATOR AND PIPELINED ADC UTILIZING THE SAME

(75) Inventor: Yu-Kai Chou, Kaohsiung (TW)

(73) Assignee: Mediatek Inc., Hsin-Chu (TW)

( * ) Notice: Subject to any disclaimer, the term of this patent is extended or adjusted under 35 U.S.C. 154(b) by 40 days.

(21) Appl. No.: 12/275,352

(22) Filed: Nov. 21, 2008

(65) Prior Publication Data

US 2010/0127910 A1    May 27, 2010

(51) Int. Cl.
*G11C 27/02* (2006.01)
*H03M 1/34* (2006.01)

(52) U.S. Cl. .............................. 327/96; 327/91; 327/94; 327/534; 341/155; 341/158; 341/172

(58) Field of Classification Search ............. 327/50–52, 327/56, 63, 65, 68–71, 74, 77, 82, 89, 91, 327/94, 96, 337, 534, 554; 341/155, 158, 341/161, 162, 164, 165, 172
See application file for complete search history.

(56) References Cited

U.S. PATENT DOCUMENTS

| | | | | |
|---|---|---|---|---|
| 5,986,599 A * | 11/1999 | Matsuo | | 341/158 |
| 6,956,519 B1 * | 10/2005 | Huang et al. | | 341/172 |
| 7,286,074 B2 * | 10/2007 | Kudoh et al. | | 341/162 |
| 7,579,975 B2 * | 8/2009 | Perdoor et al. | | 341/163 |
| 7,633,423 B2 * | 12/2009 | Cho | | 341/161 |
| 7,683,677 B2 * | 3/2010 | Chou | | 327/95 |
| 2007/0090984 A1 * | 4/2007 | Lu et al. | | 341/155 |
| 2009/0303092 A1 * | 12/2009 | Tu et al. | | 341/136 |

* cited by examiner

*Primary Examiner*—Lincoln Donovan
*Assistant Examiner*—Patrick O'Neill
(74) *Attorney, Agent, or Firm*—Thomas, Kayden, Horstemeyer & Risley

(57) ABSTRACT

A comparator includes a plurality of switches, a capacitor, an amplifier, and a latch. The switches provide an input signal during a first period and provide a reference signal during a second period. A first switch among the switches is composed of a first transistor. The capacitor receives the input signal during the first period and receives the reference signal during the second period. The amplifier is coupled to the capacitor for receiving a difference voltage between the input signal and the reference signal and amplifies the difference voltage during the second period to generate an amplified result. The determining circuit provides a digital signal according to the amplified result.

7 Claims, 4 Drawing Sheets

COMPARATOR AND PIPELINED ADC UTILIZING THE SAME

BACKGROUND OF THE INVENTION

1. Field of the Invention

The invention relates to a comparator, and more particularly to a comparator generating a digital signal.

2. Description of the Related Art

Analog-to-digital converters (ADCs) are frequently utilized to convert an analog signal, which is most commonly represented as a voltage, into a digital format. The ADCs comprise flash ADCs, interpolation ADCs, pipeline ADCs, and two-step ADCs. The ADCs utilize comparators to generate digital signals.

BRIEF SUMMARY OF THE INVENTION

A comparator and a pipelined ADC utilizing the comparator are provided. An exemplary embodiment of a comparator comprises a plurality of switches, a capacitor, an amplifier, and a latch. The switches provide an input signal during a first period and provide a reference signal during a second period. A first switch among the switches is composed of a first transistor. The capacitor receives the input signal during the first period and receives the reference signal during the second period. The amplifier is coupled to the capacitor for receiving a difference voltage between the input signal and the reference signal and amplifies the difference voltage during the second period to generate an amplified result. The determining circuit provides a digital signal according to the amplified result.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
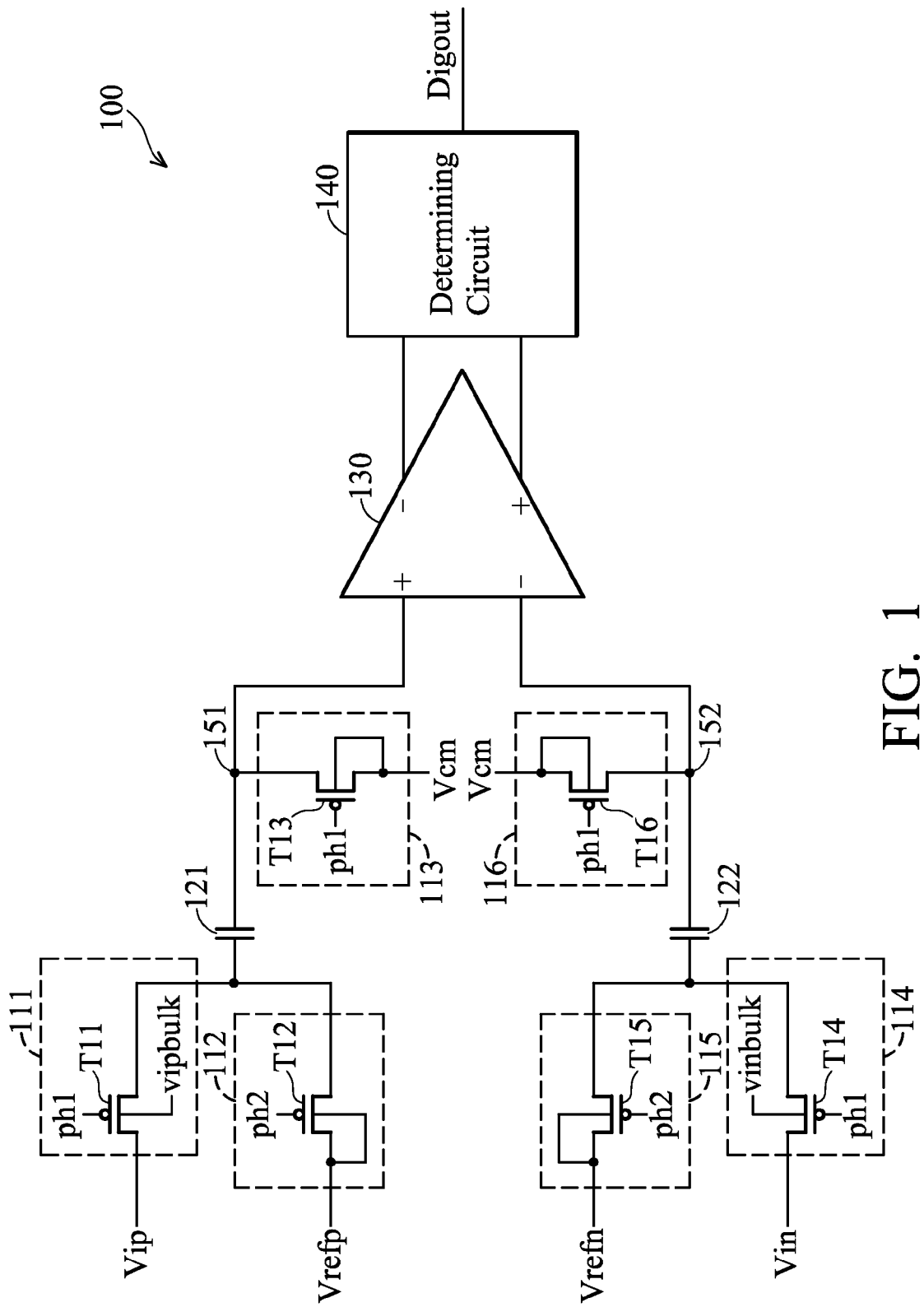
FIG. 1 is a schematic diagram of an exemplary embodiment of a comparator.

Referring to FIG. 1, a schematic diagram of an exemplary embodiment of a comparator is shown. The comparator 100 can be implemented in a subADC of a pipelined ADC. In this embodiment, the comparator 100 comprises switches 111~116, capacitors 121 and 122, an amplifier 130, and a determining circuit 140. The voltages at the nodes 151 and 152 change according to the conduction of the switches 111~116, which are controlled by control signals Ph1 and Ph2. In this embodiment, the amplifier 130 is a differential amplifier for amplifying the voltages at the nodes 151 and 152. The determining circuit 140 generates a digital signal Digout according to the amplified result provided by the amplifier 130. In this embodiment, the determining circuit 140 is implemented by a latch.

During a first period, the switches 111 and 114 are conducted and provide an input signal comprising differential voltages Vip and Vin to the capacitors 121 and 122. At the same time, the switch 113 provides a common voltage Vcm to the node 151 and the switch 116 also provides the common voltage Vcm to the node 152. Thus, the capacitor 121 samples the differential voltage Vip and the capacitor 122 samples the differential voltage Vin.

During a second period following the first period, the switches 112 and 115 conduct and provide a reference signal comprising voltages Vrefp and Vrefn to the capacitors 121 and 122. At this time, the voltage at node 151 is a difference voltage between the differential voltage Vip and the voltage Vrefp and the voltage at the node 152 is another difference voltage between the differential voltage Vin and the voltage Vrefn. The amplifier 130 amplifies the voltages at the nodes 151 and 152. The determining circuit 140 generates a digital signal Digout according to the amplified result. In this embodiment, the determining circuit 140 determines whether the output signal of the amplifier 130 exceeds zero. For example, when the input signal exceeds the reference signal, the digital signal Digout is at a high level. When the input signal is less than the reference signal, the digital signal Digout is at a low level.

At least one of the switches 111~116 is composed of a transistor comprising a P-type or an N-type channel, e.g. at least one of the switches 111~116 is implemented by a PMOS or an NMOS. Thus, the capacitor 121 or 122 only utilizes one transistor to receive the corresponding voltage. For example, if the switch 111 is a transistor T11 comprising the P-type channel, the capacitor 121 only utilizes the transistor T11 to receive the differential voltage Vip. In this embodiment, the switches 111~116 are implemented by transistors T11~T16, each comprising the P-type channel. Since the operations of the switches 111~113 and the capacitor 121 are same as the operations of the switches 114~116 and the capacitor 122, only the operations of the switches 111~113 and the capacitor 121 are described in the following.

During the first period, the control signal Ph1 is at a low level and the control signal Ph2 is at a high level, the transistors T11 and T13 are therefore turned on and the transistor T12 is turned off. Thus, the capacitor 121 only utilizes the transistor T11 to receive the differential voltage Vip and only utilizes the transistor T13 to receive the common voltage Vcm.

During the second period, the control signal Ph1 is at the high level and the control signal Ph2 is at the low level, the transistors T11 and T3 are turned off and the transistor T12 is turned on. Thus, the capacitor 121 only utilizes the transistor T12 to receive the voltage Vrefp such that the voltage at the node 151 is a difference voltage between the differential voltage Vip and the voltage Vrefp. Simultaneously, the amplifier 130 amplifies the voltage at the node 151. The determining circuit 140 generates a digital signal Digout according to the amplified result.

Figure 2A:
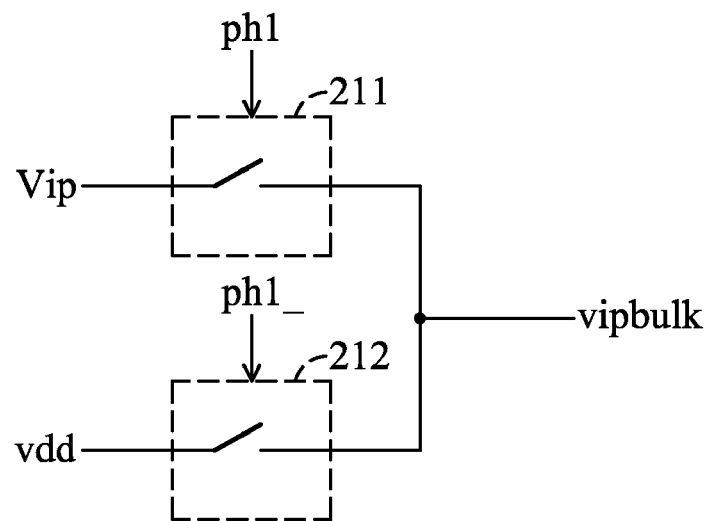
FIGS. 2a and 2b are schematic diagrams of the voltage.
Figure 2B:
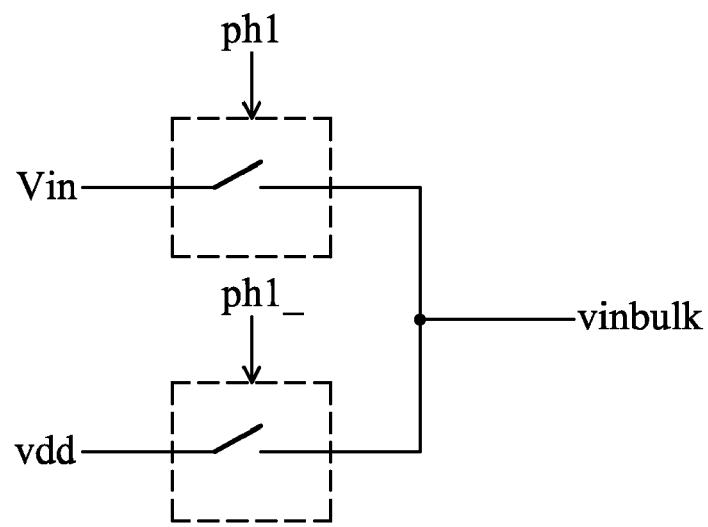

Referring to FIG. 1, the transistor T11 comprises a base receiving voltage vipbulk. Referring to FIG. 2a, a schematic diagram of the voltage vipbulk is shown. During the first period, the control signal Ph1 is at the low level such that a switch 211 is turned on. Thus, the voltage vipbulk is equal to the differential voltage Vip. During the second period, the control signal Ph1 is at the high level such that the switch 212 is turned on. Thus, the voltage vipbulk is equal to the power voltage vdd. The power voltage vdd exceeds that differential voltage Vip. Additionally, the control signals Ph1 and Ph1_ are inverse. Referring to FIG. 2b, a schematic diagram of a voltage vinbulk is shown. Since FIGS. 2a and 2b have the same principle, description of FIG. 2b is omitted for brevity.

Referring to FIG. 1, the transistor T12 comprises a base receiving the voltage Vrefp. The transistor T13 comprises a base receiving the common voltage Vcm. The common voltage Vcm is an average of the power voltage vdd and a grounding voltage (not shown). Generally, the grounding voltage is 0V. In some embodiments, the bases of the transistors T11~T13 receive the power voltage vdd.

Figure 3:
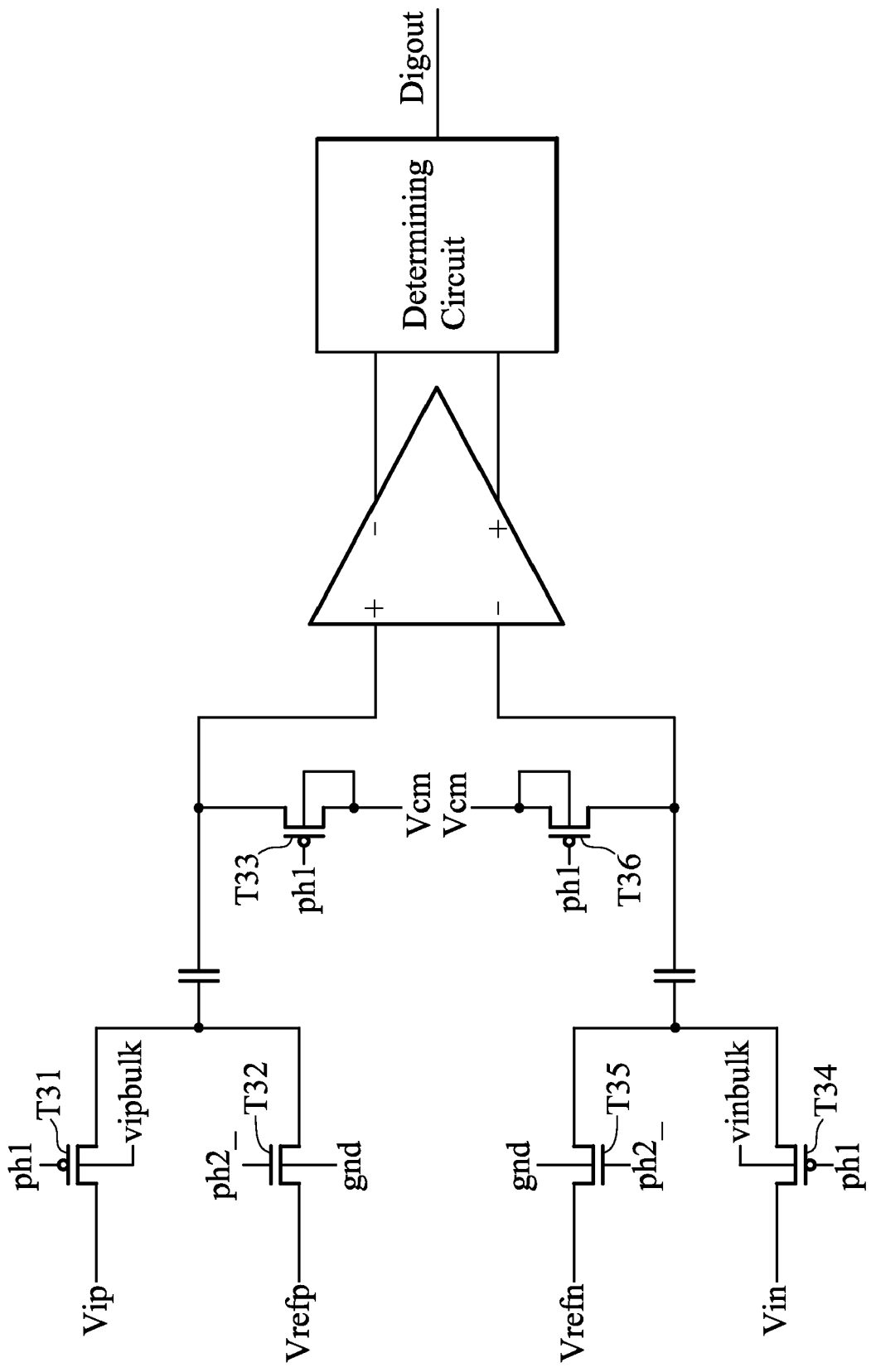
FIG. 3 is a schematic diagram of another exemplary embodiment of a comparator.

The switches 111-116 can be implemented by PMOS, NMOS, or any other type of switching circuits, as long as at least one switch is composed of a single transistor in order to reduce power consumption. Referring to FIG. 3, a schematic diagram of another exemplary embodiment of a comparator is shown. The transistors T32 and T35 comprise the N-type channels and others (T31, T33, T34, and T36) comprise the P-type channels. The bases of the transistor T32 and T35 receive the grounding voltage gnd. The control signal Ph2_ shown in FIG. 3 and the control signal Ph2 shown in FIG. 1 are inverse.

Figure 4:
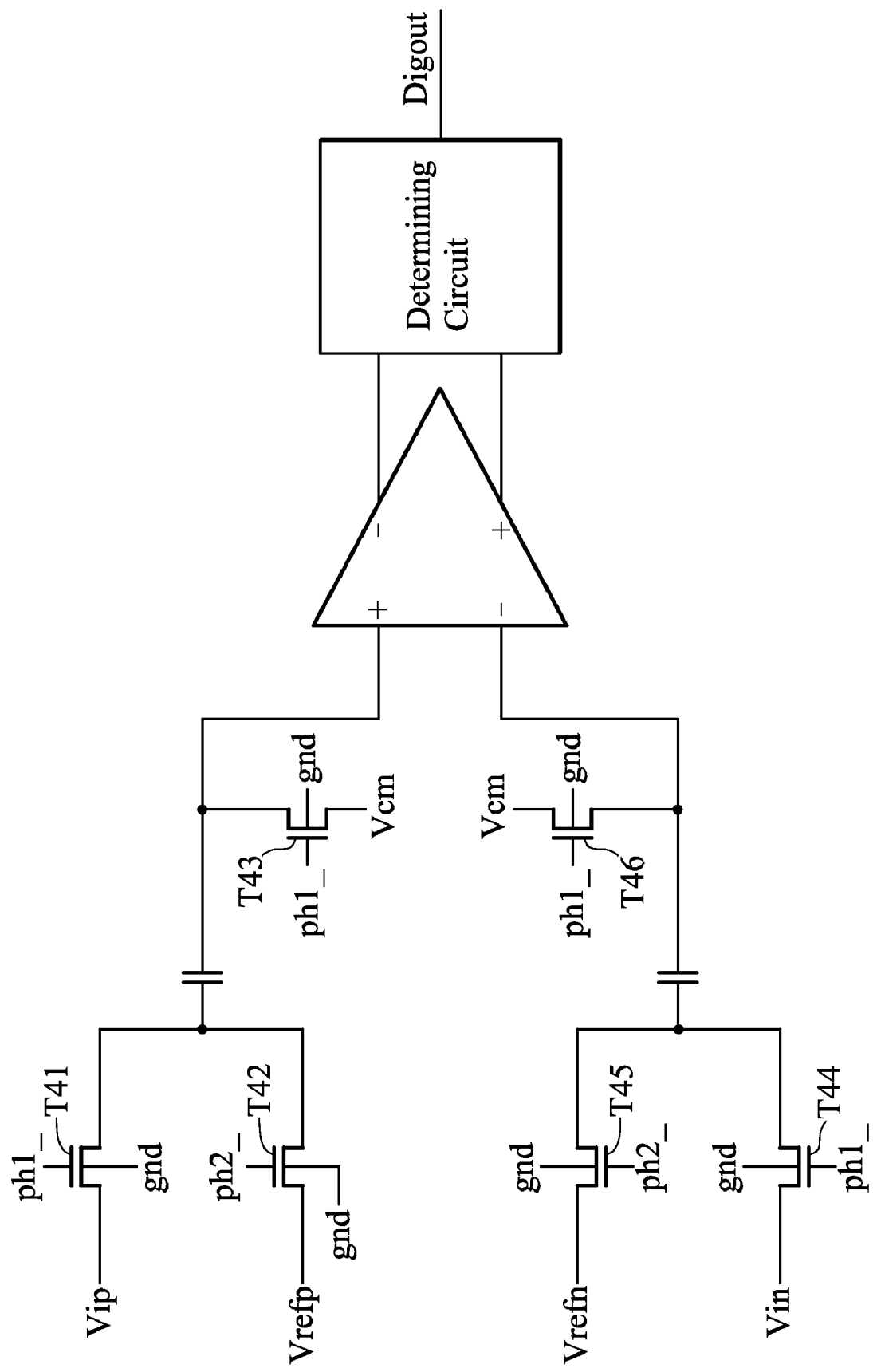
FIG. 4 is a schematic diagram of another exemplary embodiment of a comparator.

Referring to FIG. 4, a schematic diagram of another exemplary embodiment of a comparator is shown. In this embodiment, transistors T41~T46 comprise the N-type channels and comprise bases receiving the grounding voltage gnd. Additionally, the control signal Ph1_ and the control signal Ph1 shown in FIG. 1 are inverse. The control signal Ph2_ and the control signal Ph2 shown in FIG. 1 are inverse.

In above embodiments, by utilizing PMOS or NMOS to implement the switches and coupling the base of the PMOS/NMOS to appropriate voltage level, the power consumption of the comparator 100 can be reduced and the clock distribution can be simplified significantly.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A comparator, comprising:
   a plurality of switches for providing an input signal during a first period and providing a reference signal during a second period, wherein a first switch among the switches is composed of a first transistor;
   a capacitor for receiving the input signal during the first period and receiving the reference signal during the second period;
   an amplifier coupled to the capacitor for receiving a difference voltage between the input signal and the reference signal and amplifying the difference voltage during the second period to generate an amplified result; and
   a determining circuit for providing a digital signal according to the amplified result,
   wherein the capacitor only utilizes the first transistor to receive the input signal during the first period,
   wherein the first transistor comprises a P-type channel, and
   wherein the first transistor comprises a base receiving the input signal during the first period and receiving a power voltage during the second period, and the power voltage exceeds the input signal.

2. The comparator as claimed in claim 1, wherein a second switch among the switches is composed of a second transistor, and wherein the capacitor only utilizes the second transistor to receive the reference signal during the second period.

3. The comparator as claimed in claim 2, wherein the second transistor comprises the P-type channel and a base receiving one of the reference signal and the power voltage.

4. The comparator as claimed in claim 2, wherein a third switch among the switches is composed of a third transistor, and wherein the capacitor only utilizes the third transistor to receive a common voltage.

5. The comparator as claimed in claim 4, wherein the third transistor comprises the P-type channel and a base receiving one of the common voltage and the power voltage.

6. The comparator as claimed in claim 2, wherein the second transistor comprises an N-type channel and a base receiving a grounding voltage.

7. A comparator, comprising:
   a plurality of switches for providing an input signal during a first period and providing a reference signal during a second period, wherein a first switch among the switches comprises a first transistor;
   a capacitor for receiving the input signal during the first period and receiving the reference signal during the second period;
   an amplifier coupled to the capacitor for receiving a difference voltage between the input signal and the reference signal and amplifying the difference voltage during the second period to generate an amplified result; and
   a determining circuit for providing a digital signal according to the amplified result;
   wherein the first transistor comprises a base receiving the input signal during the first period and receiving a power voltage during the second period, and the power voltage exceeds amplitude of the input signal.

* * * * *